United States Patent
Kanter

(10) Patent No.: US 10,418,943 B2
(45) Date of Patent: Sep. 17, 2019

(54) SYSTEM AND METHOD FOR HIGH PERFORMANCE PHOTONIC DOWN-CONVERSION OF MICROWAVE SIGNALS

(71) Applicant: NuCrypt, LLC, Evanston, IL (US)

(72) Inventor: Gregory S. Kanter, Chicago, IL (US)

(73) Assignee: Nucript LLC, Evanston, IL (US)

( * ) Notice: Subject to any disclaimer, the term of this patent is extended or adjusted under 35 U.S.C. 154(b) by 0 days.

(21) Appl. No.: 16/156,562

(22) Filed: Oct. 10, 2018

(65) Prior Publication Data
US 2019/0109564 A1   Apr. 11, 2019

Related U.S. Application Data

(60) Provisional application No. 62/570,854, filed on Oct. 11, 2017.

(51) Int. Cl.
| | |
|---|---|
| *H03D 7/16* | (2006.01) |
| *H04B 10/556* | (2013.01) |
| *H04B 1/00* | (2006.01) |

(52) U.S. Cl.
CPC ............ *H03D 7/163* (2013.01); *H03D 7/161* (2013.01); *H03D 7/165* (2013.01); *H04B 1/006* (2013.01); *H04B 10/5561* (2013.01)

(58) Field of Classification Search
CPC .................................................... H03D 7/163
See application file for complete search history.

(56) References Cited

U.S. PATENT DOCUMENTS

2002/0131662 A1*  9/2002  Strutz ................. H03D 9/00
                                                         385/1
2013/0236187 A1*  9/2013  Middleton ............ H04B 10/00
                                                         398/116

* cited by examiner

*Primary Examiner* — Keith Ferguson
(74) *Attorney, Agent, or Firm* — Nadya Reingand; Yan Hankin

(57) ABSTRACT

A method for down-converting an RF signal is described that optically phase modulates an RF signal onto an optical carrier then applies an RF local oscillator (LO) phase modulation which down-converts the RF signal to an intermediate frequency after appropriate optical signal processing and optical-to-electrical photo-detection. The LO phase modulator is constructed such that a common hot electrode is shared among more than one optical mode, where an optical mode can be separate waveguides or optical wavelengths. The relative phase of the LO frequency applied to each optical mode can be different between the different optical modes. The resulting down-converted photo-detected signals of different LO-phase can be processed to reduce noise. A single LO phase modulator can down-convert multiple RF signals carried by multiple optical wavelengths, and a harmonic generation stage with multi-phase-matching peaks can be used to linearize each RF signal.

20 Claims, 8 Drawing Sheets

SYSTEM AND METHOD FOR HIGH PERFORMANCE PHOTONIC DOWN-CONVERSION OF MICROWAVE SIGNALS

CROSS-REFERENCE TO RELATED APPLICATIONS

The present patent application claims priority to U.S. Provisional application 62/570,854 filed Oct. 11, 2017, which fully incorporated herein by reference.

FIELD OF THE INVENTION

The field of the invention is microwave photonics, including the modulation of photons with radio frequency (RF) or microwave signals and the use of photonics to aid in distributing and measuring the microwave signal.

BACKGROUND

Photonic technology can be used to enhance the measurement and distribution of microwave signals. This field is sometimes called radio-frequency (RF) or microwave photonics. As an example, antenna remoting is a term that refers to modulating a microwave or RF signal onto an optical signal. The modulated optical signal can then be sent over long distances via a fiber optic cable which has lower loss, weight, and cost than an RF cable and does not suffer from electro-magnetic interference, to a receiver that converts the signal back into the electrical domain. Ideally very simple equipment is located at the antenna as the antenna location is chosen for optimal reception and often there may be space or power constraints near the antenna.

Ideally the microwave signal is exactly reproduced at the receiver with no loss of signal integrity. However, usually the signal integrity is limited by nonlinearities in the optical modulator or optical demodulator at the receiver. This creates spurious signals whose magnitude depends on the magnitude of the input RF signal, thereby limiting the dynamic range of operation. This effect is sometimes characterized by the spurious free dynamic range (SFDR) metric. Methods to linearize modulators are often complex, and one does not want complex equipment that may be sensitive to drift or precise parameter settings near the remote antenna. A method to cancel out the third order nonlinear distortion that uses the natural modulation efficiency (characterized by the voltage required to induce a $\pi$ phase shift, or $V_\pi$) difference of an optical modulator between two different optical wavelengths or the difference between two polarization axes of an optical modulator have been demonstrated. While effective, it turns out such methods also reduce the gain of the systems which in turn reduces the noise figure. This reduces the utility of such linearization methods. A simple method to enhance the SFDR using second harmonic generation (SHG) has been proposed which is compatible with photonic integrated circuit (PIC) integration. Here SHG enhances the effective modulation index of the phase modulator, which allows for the generation of a more nonlinear signal which can be subtracted from the desired signal (which does not undergo SHG) to remove distortion terms.

Another benefit of RF-photonics can be all optical down-conversion, which in principle can replace the electrical mixers more commonly used to down-convert a very high microwave carrier frequency to a lower and more easily detectable carrier frequency. Electrical mixers often have loss, added distortions, and less operating frequency range than desired. Usually these systems are similar to standard heterodyne detection in that they mix in the desired frequency band with a different signal in the image frequency band. The image band can in principle be separated from the desired signal if the signal is measured both in-phase (I) and in quadrature phase (Q). However, such measurements typically require multiple modulators and thus can be inefficient in terms of the electrical power required to down-convert the signal and the number of components required to realize the system. They also may not provide complementary outputs, where complementary outputs allow for noise reduction of optical intensity noise via balanced detection. An optical hybrid has been used to provide for complementary outputs for an optical I/Q down-conversion system, but this system formed a very long interferometer that is not well suited for some applications like optical remoting.

A prior art implementation of an optical I/Q downconverter is shown in FIG. 1. A laser 100 at a wavelength of $\lambda$ passes through a signal phase modulator 102 which is modulated by the RF signal of interest with a carrier frequency off $f_{RF}$. The optical output from the signal phase modulator is split by an optical splitter 101 into two arms, one arm is modulated by an in-phase (I) down-conversion (DC) phase modulator 104 and the other arm is modulated by a quadrature phase (Q) DC phase modulator 106. Both DC phase modulators are driven by a LO at frequency $f_{LO}$, but before the Q phase modulator the LO is shifted in phase by $\pi/2$ in an electrical phase shifter 108 which could be realized by a fixed length of RF cable or a 90° electrical hybrid circuit. The optical outputs from the DC phase modulators are filtered using optical filters 110,112 with one optical filter after the I DC phase modulator 110 and one after the Q DC phase modulator 112. The filters can be notch filters or bandpass filters or other types of filters including near-loss-less phase-only filters that convert the signal from pure phase modulation, which is generally not detectable using a direct optical-to-electrical detector, to amplitude modulation which is detectable with direct optical-to-electrical detectors. The filtered signals are detected using photodetectors 114,116. The output of the photodetectors are now the I and Q electrical signals at the IF frequency of $f_{IF}=f_{RF}-f_{LO}$, assuming $f_{LO}<f_{RF}$ (or otherwise $f_{IF}=f_{LO}-f_{RF}$). However, they also carry signals at the image band frequency into the signal phase modulator near $f_{RF}-2\cdot f_{IF}$. By subtracting the I and Q electrical signals with an appropriate phase shift in an I/Q IF 90° hybrid 118 the signal and image frequency can be separated allowing for detection of the desired signal at $f_{RF}$ without the distorting image band. Note that two separate phase modulators are used in this design, each having a separate hot electrode carrying the LO signal.

A method of creating a microwave photonic link that makes use of a shared electrode in the signal modulator offers some benefits including the ability to match the frequency response of the two effective modulators. The two modulators modulate the RF signal onto different optical paths with different modulation index, thereby allowing for subtraction of some nonlinear distortions. The known design uses amplitude modulators and does not perform down-conversion. Amplitude modulators are usually based on the Mach-Zehnder interferometer (MZI) configuration, which is an interference-based device and requires careful setting or knowledge of the inherent phase bias to achieve high dynamic range. In antenna remoting applications it is more desirable to use a simple phase modulator that does not require a phase bias. Such phase-modulation based systems have been demonstrated, including linearized systems that employ down-conversion.

Optical modulators such as Mach-Zehnder Interferometer (MZI) style Lithium Niobate (LN) modulators sometimes operate in the "push-pull" configuration where a common hot electrode applies a phase shift of opposite sign to two arms of an interferometer. In an interferometer these two arms are combined optically to convert the phase modulation into an intensity modulation.

What is needed is a system or method to efficiently down-convert and measure microwave signals over a photonic link. The RF signal should be imparted using a simple phase modulator avoiding for instance the need for setting a phase bias voltage. It should preserve a high dynamic range and allow the possibility of noise reduction via balanced detection. It should be capable of generating both in-phase and quadrature phase signals in a simple configuration that is compatible with photonic integrated circuit (PIC) integration. The number of independent hot electrodes should also be minimized to simplify the system and reduce or eliminate the requirement for electrical splitters to distribute the LO to multiple electrodes. The system should also make maximal use of resources, including the ability to down-convert multiple input signals using a single down-converter.

SUMMARY

We describe a system and method for measuring a microwave signal over an RF-photonic link. The system uses a signal phase modulator to apply the RF signal to be measured onto an optical signal and a down-conversion (DC) phase modulator (PM) to apply an RF local oscillator (LO) to the modulated optical signal which down-converts the RF signal to an intermediate frequency (IF) after appropriate optical signal processing such as filtering and optical-to-electrical (O/E) photo-detection. The DC phase modulator is constructed such that a common hot electrode is shared among more than one optical mode, where an optical mode can be separate waveguides or optical wavelengths or other degrees of freedom. The invention applies a phase shift at the LO frequency to each optical mode where the relative phase of the LO may be different between the different signal modes. After being phase modulated with the LO these optical signal modes are optically processed and detected by an O/E detector. The down-converted photo-detected signals can be electrically processed to allow for noise reduction via balanced detection or separation of the signal and image bands.

In one embodiment the two modulated optical modes entering the DC phase modulator experience a relative applied LO phase shift of opposite sign ($\pi$ out-of-phase) thereby allowing for balanced detection of the two signals in two separate photodiodes that are subsequently combined in a differencing circuit. These two signals can be called the in-phase (I) and complementary in-phase ($\bar{I}$) signals. The $\pi$ phase shift can be imposed by spatially separating the two modes and passing one mode between a common hot electrode driven by the LO and a first ground electrode and passing the other mode between the common hot electrode and a second ground electrode. Balanced subtraction allows for the cancellation of common mode noise such as relative intensity noise (RIN) and thus improved signal-to-noise ratio. Since only one hot electrode is used to generate both signals, there is no need to split the LO signal electrically external to the DC PM which makes the design voltage-efficient and compact. Additionally, because the two signals share a common electrode it will be easier to achieve nearly identical frequency response functions and thus improved performance. The desired $\pi$ relative phase shift between the two optical signals is inherent in the design and will operate for broad band signals and over a wide range of LO frequencies.

In another embodiment the modulated signal can be split into two waveguides, the modulated signal in the two waveguides having different optical delays before the LO phase modulation such that each signal is effectively modulated by the LO at a relative phase of $\pi/2$ to generate both I and quadrature phase (Q) signals using a common hot electrode in the DC phase modulator. In general the relative LO phase between the two modes can be set to any desired value $\phi$, where in this case $\phi=\pi/2$. These signals can optionally be subsequently processed to allow for removing an undesired image band, as is known in the art. This design functions for a narrow band of LO frequencies because the effective LO phase shift between the modes depends on the fixed optical delay, but if the time delay is a variable optical delay then the LO frequency can be tuned accordingly.

The two modes could alternatively be different wavelengths, where a wavelength-dependent phase shift before the LO phase modulation leads to the two different LO signal phases. In this case the two wavelengths could propagate in the same waveguide that experiences the phase shift at the LO frequency and then be split by a wavelength division multiplexer (WDM) after the LO phase modulation to allow the modes to be separately optically processed. The wavelength dependent phase shift can be a dispersive element or it can be generated by splitting the wavelengths into separate arms using a WDM, making one arm longer than the other to impose a relative time delay between the wavelengths, then recombining the arms. A carrier-suppressed modulator can optionally generate both wavelengths from a common laser, which is beneficial for subtracting out common-mode laser noise e.g. RIN.

Another embodiment of the invention applies linearization techniques such as when using second harmonic generation (SHG) for enhancing the linearity of the system (linearization). A laser at wavelength $\lambda$ is modulated in the signal PM. The optical signal is split after the signal PM and one arm is frequency doubled in a SHG stage to create an optical output at wavelength $\lambda/2$. The SHG signal effectively has twice the phase modulation depth imparted on it from the signal phase modulator than does the $\lambda$ wavelength signal. The SHG signal is phase modulated by the LO and then processed (e.g. optically filtered), photo-detected, and the photo-detected signal subtracted from the photo-detected signal at wavelength $\lambda$ to generate a linearized down-converted output signal so as to reduce distortions such as third order intermodulation mixing distortion. The optical signal at $\lambda/2$ can be phase-modulated with the LO using a shared electrode as the optical signal at wavelength $\lambda$, or the harmonic and fundamental wavelengths can be modulated by the LO independently.

Another embodiment is compatible with simultaneously down-converting multiple signals via wavelength division multiplexing. For instance, there can be two or more signal modulators each receiving a RF signal of the same or different RF carrier frequency. Here we consider the case where the two signal modulators receive the same RF frequency, as would be the case when multiple antennas in different locations receive the same signal where the multiple antennas allow information about the directionality of the signal to be determined or allow the receiver comprised of multiple antennas to function as if it were a single antenna of a larger aperture, though other cases are also contained within the invention. The two signal modulators are fed with optical signals of different wavelength. The two wavelengths can be combined and propagated to a receiver over a single optical fiber. The two wavelengths can both undergo down-conversion in the same DC phase modulator driven by an LO applied to a common electrode. After the DC PM the two wavelengths can be separated in a WDM, and each wavelength optically processed and detected as usual with each wavelength representing the RF signal applied at their respective signal phase modulators.

The two-wavelength optical signal carrying RF signals from two different modulators can also optionally be split before applying the LO phase modulation so that it can undergo SHG in an SHG stage. The SHG stage can be designed to have multiple phase matching peaks so that both the input wavelengths will undergo SHG and thus a doubling of their phase modulation depth. The second harmonic wavelength of both input wavelengths can then be down-converted in a DC PM that can share an electrode with the harmonic wavelength, the DC PM thus operating on multiple wavelengths simultaneously. The two second harmonic wavelengths can be separated in a WDM after the DC phase modulator and processed and detected as before, for instance to linearize the detected signals at the fundamental wavelengths.

It is also possible to share a hot electrode between the $\lambda$ and $\lambda/2$ wavelengths without splitting the wavelengths into different arms. For instance a small part of the modulated signal, say 12.5%, is wavelength converted to $\lambda/2$ in a SHG stage and both the $\lambda$ and the $\lambda/2$ wavelengths continue to propagate in the same waveguide. Both wavelengths are then DC phase modulated using a shared hot electrode. The wavelengths can be split into different arms after the DC PM allowing filtering and O/E detection before subtracting the detected electrical signals to produce a linearized and down-converted RF output.

DETAILED DESCRIPTION

In the following description, for purposes of explanation, numerous specific details are set forth in order to provide a thorough understanding of the invention. It will be apparent, however, to one skilled in the art that the invention can be practiced without these specific details.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not to other embodiments. In general, features described in one embodiment might be suitable for use in other embodiments as would be apparent to those skilled in the art.

Figure 1:
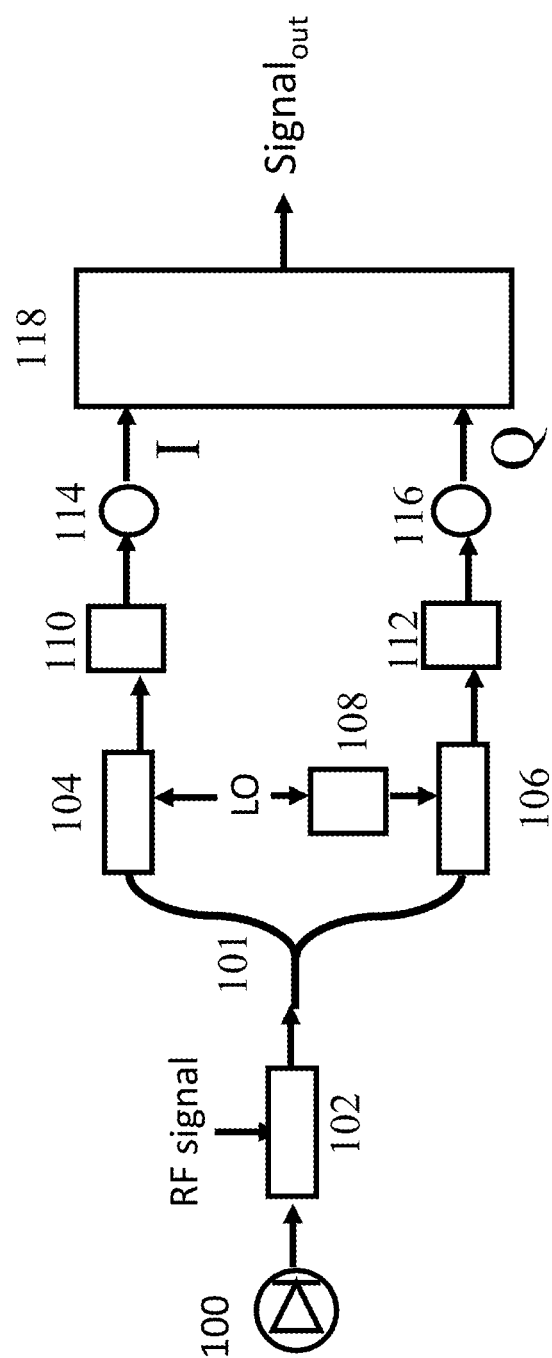
FIG. 1 A prior art embodiment of an I/Q photonic down-conversion system using two modulators driven with LO's of $\pi/2$ relative phase.
Figure 2:
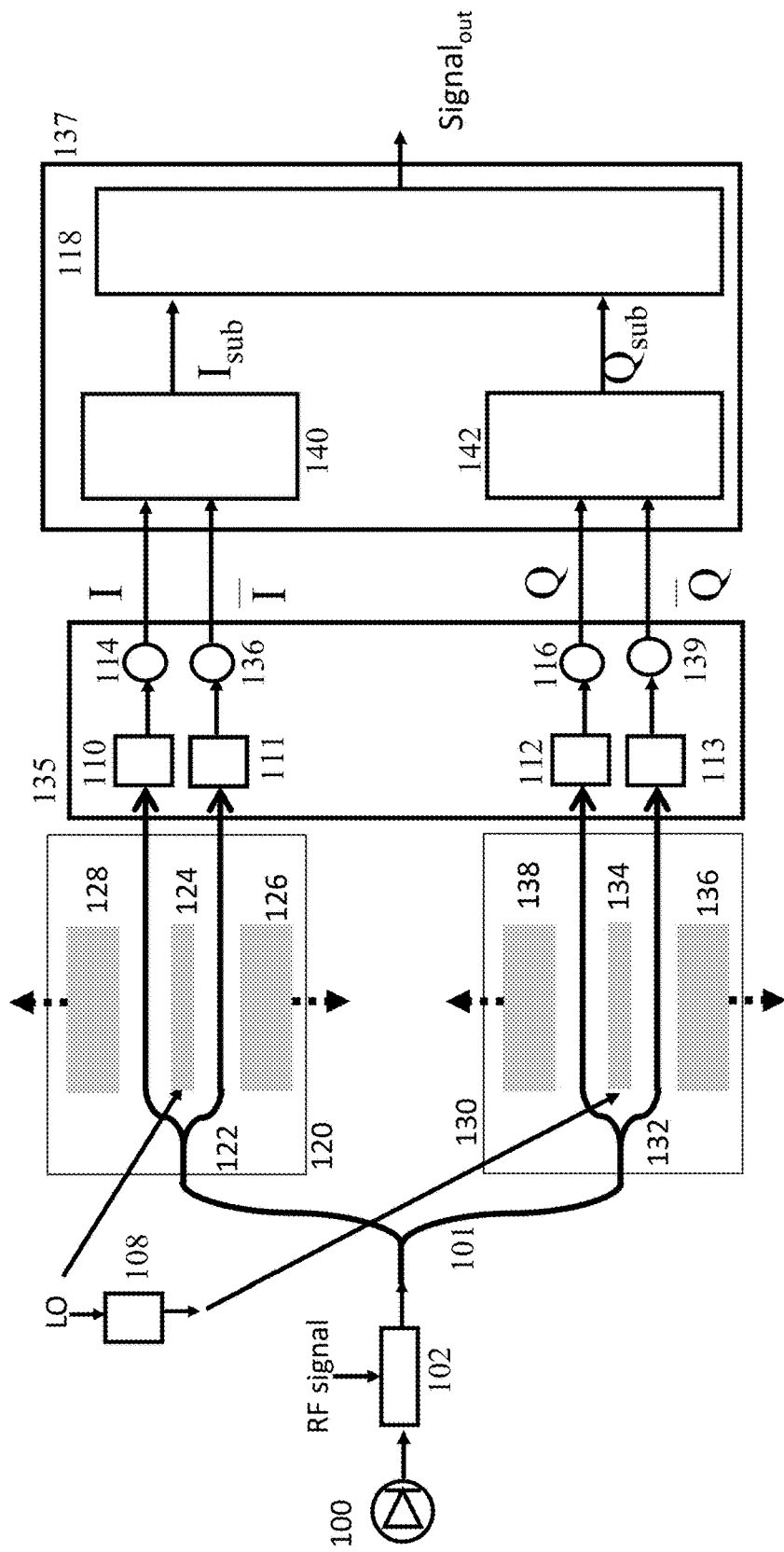
FIG. 2 Balanced I/Q down-conversion scheme where a common hot electrode is shared for the I/Ī signals and another common hot electrode the Q/Q̄ signals, where the complementary signals are combined (subtracted) to allow for balanced detection with noise cancellation. The balanced I and Q detected signals are further processed to reject an image band.

An embodiment of the invention is shown in FIG. 2. This system performs a photonic down-conversion function similar to that of FIG. 1, but allows for balanced detection on the I and the Q signal to reduce noise and thus improve signal-to-noise ratio without requiring any new electrical inputs or additional modulators. Components that are the same will be labeled with identical numbers. As in FIG. 1 a laser and signal modulator generate an optical signal that is split in an optical splitter. The outputs from the splitter are sent to two complementary DC phase modulators, which could be realized in the same photonic integrated circuit (PIC), that are in-phase (I) 120 or at quadrature phase (Q) 130, each of which now have two complementary outputs where complementary outputs are phase modulated with the same LO but with the effective LO being out-of-phase by 180°. Each DC PM has a splitter creating two optical paths 122 or 132, a shared hot electrode 124,134, and ground electrodes 126,128 and 136,138, respectively, such that the electrical LO is applied to a common hot electrode shared among two optical paths in each DC PM. A LO is sent to each modulator which will eventually down-convert the optical signal to the intermediate frequency frequency (IF), and a phase shift of $\pi/2$ is applied to the LO by a phase shifter 108 before the Q down-conversion phase modulator to obtain the quadrature phase. Alternative methods of obtaining quadrature phase between the two DC phase modulators such as inserting an optical phase shifter or an optical delay in the fiber connecting one of the DC phase modulators to the first optical splitter 101 could also be used. All four outputs from the complementary down-conversion phase modulators are processed in an opto-electrical processor 135 that is comprised of optical filters 110,111,112, 113, such as could be realized by Fiber Bragg gratings, and photodetectors 114,136,116,139, creating down-converted electrical signals having different effective LO phases. The down-converted electrical signals are then processed in an electrical signal processor 137, which could be either an analog processor as shown or a digital signal processor after the down-converted electrical signals are digitized in analog-to-digital converters. Complementary I signals are subtracted using an in-phase subtraction circuit 140 which could be realized by subtracting the currents from the photodetectors or by using an electrical hybrid, thereby generating the balanced subtracted in-phase signal $I_{sub}$. The complementary Q signals are subtracted in a quadrature-phase subtraction circuit 142 generating the balanced subtracted quadrature-phase signal $Q_{sub}$. The $I_{sub}$ and $Q_{sub}$ signals from the subtraction circuits can optionally be further processed in an I/Q IF 90° hybrid 118 if desired to separate the RF signal and the image band. Such processing can also take place in post-processing after the use of analog-to-digital converters (ADCs) as is known in the art.

The complementary down-converting phase modulators are drawn in FIG. 2 as separate boxes but could both be located on the same substrate forming a photonic integrated circuit (PIC). Other components such as the optical splitter and optical filters could likewise be incorporated into a PIC as appropriate although they are separated here for clarity.

Figure 3:
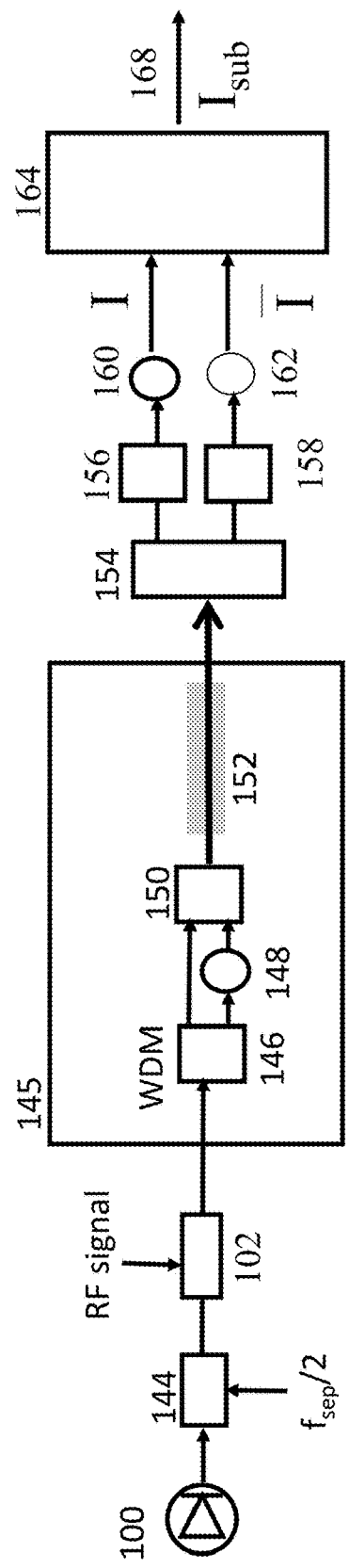
FIG. 3 Dual wavelength implementation where the two wavelengths are generated using a common laser via a carrier-suppressed intensity modulator. Both wavelengths are phase modulated by an RF signal, then separated into two arms by a WDM so a wavelength-dependent phase shift can be applied by relative a temporal delay between the two arms, then recombined in a second WDM and modulated using a common hot electrode in a common waveguide (a common ground electrode is on the bottom of the down-conversion phase modulator). The wavelengths can be re-separated in another WDM then individually optically processed and detected. Here the wavelength dependent phase shift is $\pi$ so that balanced detection can be employed.

Another embodiment of the invention is shown in FIG. 3. Here two optical modes of different wavelength are generated from a common laser at wavelength $\lambda_o$ by using a carrier-suppressed Mach-Zehnder modulator (CS-MZI) 144. The CS-MZI generates two distinct wavelength modes centered around $\lambda_o$. Both modes are phase-modulated by the RF signal in a signal PM 102 before entering the DC-PM 145. The DC-PM applies a wavelength-dependent phase shift, which in FIG. 3 is generated by a first wavelength division multiplexer (WDM) 146 that separates the two wavelength modes into different arms, a temporal delay element 148 that applies a time delay equivalent to a π phase shift at the LO frequency, a second WDM 150 that recombines the two wavelength modes, then a common hot electrode 152 driven by the LO. In FIG. 3 the ground electrode is not pictured since it may be on the under-side of the modulator. The two LO modulated wavelengths are separated in a third WDM 154 so that they can be independently electro-optically processed using different filters 156,158 and photo-detectors 160,162 generating two complimentary down-converted electrical signals which are then subtracted in an electrical combiner 164 to create the balanced-detected output signal 168. Since the two wavelength modes are derived from the same laser a substantial amount of common mode noise, e.g. RIN, cancels out.

Figure 4:
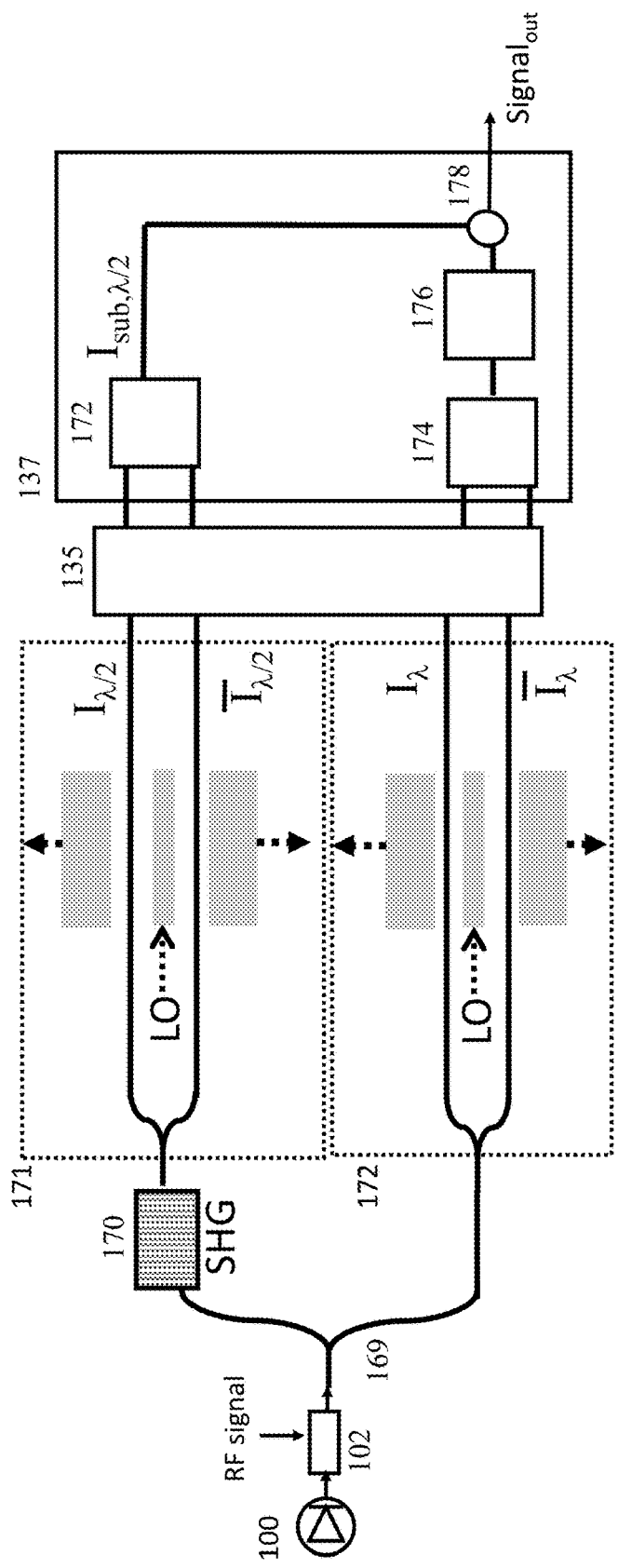
FIG. 4 Balanced detection photonic down-conversion scheme where both the fundamental signal at wavelength $\lambda$ and a SHG linearization signal at wavelength $\lambda/2$ are used. The detected signals at both wavelengths can be subtracted for enhanced linearity.

Another embodiment of the invention is shown in FIG. 4. This embodiment is only producing the in-phase signals (I and Ī), but could be expanded to create both in-phase and quadrature-phase if desired by using similar methods as previously described. An optical splitter 169 splits the signal from the signal phase modulator into two paths, one of which is sent to the in-phase complementary down-conversion phase modulator 172 generating the complimentary in-phase signals, similar to that of FIG. 2. The other output of the splitter is sent to a second harmonic generation stage (SHG) 170 which may or may not be part of the same substrate of the DC-PM. The SHG stage converts input optical light at wavelength λ to wavelength λ/2, and at the second harmonic (SH) wavelength of λ/2 it effectively doubles the phase modulation depth that was applied at the signal phase modulator. The SHG stage could be realized for instance by using periodically poled Lithium Niobate waveguides that are phase-matched for SHG at the laser wavelength. The output from the SHG stage is sent to an SHG down-conversion complementary phase modulator 171 that is driven with the same LO signal as the in-phase down-conversion complementary phase modulator. The optical output signals from the SHG DC complementary PM and the in-phase complementary down-conversion phase modulator are sent as before to the opto-electrical processor (135) that may be comprised of optical filters and photo-detectors. The outputs from the opto-electrical processor being sent to an electrical processor 137 that in this case subtracts the complementary signals in each wavelength band in combiners 172,174, attenuates one of the subtracted signals in an electrical attenuator 176 so as to balance the relative size of the balanced down-converted signals at λ and λ/2 so that after subtracting the two signals in a linearization combiner 178 an unwanted nonlinear distortion is removed from the output signal thereby improving the dynamic range of the down-converted signal.

The balanced detection at each wavelength will subtract out common mode noise such as laser RIN and generate a higher signal-to-noise ratio on the photo-detected down-conversion signals. These signals can subsequently be subtracted as is known in the art to reduce unwanted distortions, such as third order mixing terms, which is also known as linearizing the system.

Figure 5:
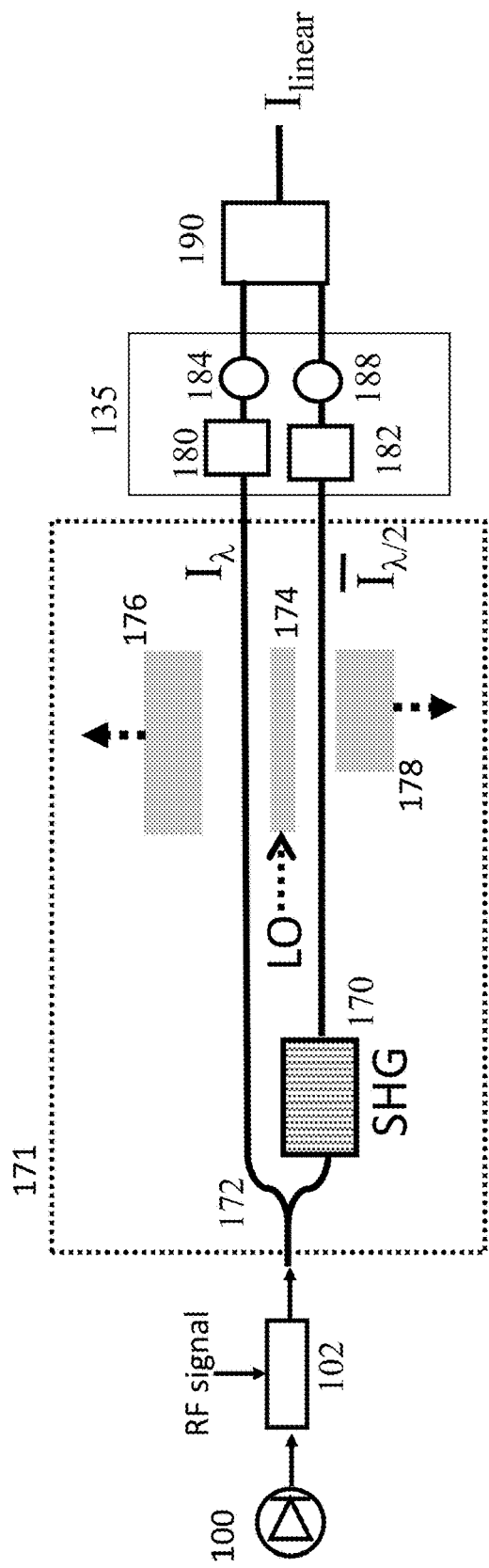
FIG. 5 SHG linearized down-conversion using a common hot electrode for signals at $\lambda$ and $\lambda/2$.

FIG. 5 shows an embodiment where a common hot electrode is used for phase-modulating the LO onto both the fundamental and harmonic wavelengths in an SHG linearized system. The SHG linearized modulator 171 has an integrated optical splitter 172 and one output of the splitter goes to an SHG stage 170 that doubles the optical frequency and the optical phase modulation depth. The fundamental and harmonic frequencies are both modulated by a common hot electrode 174. The ground electrode for the fundamental wavelength 176 being longer than the ground electrode for the harmonic wavelength 178 in order to compensate for the larger number of optical cycles in the phase modulator at the harmonic wavelength and thus apply optical LO phase modulation depth at both wavelengths. The SHg linearized modulators creating an in-phase signal at λ and a complementary in-phase signal at λ/2 that are subsequently filtered 180,182 and detected in their respective optical-to-electrical detectors 184,188 then added in a combiner 190 which effectively subtracts the signals. since in this design they are naturally complementary (π out-of-phase). A means of balancing of the signal sizes before subtraction for optimal linearity is not shown, but could be performed with optical or electrical attenuators as needed. We note it is possible to also detect the unconverted fundamental light exiting the SHG stage to perform balanced detection at the fundamental wavelength. It is generally more important to use balanced detection at the fundamental wavelength, rather than the SHG wavelength, since the SHG photo-detected signal is typically smaller than the harmonic photo-detected signal which is thus is less influenced by RIN noise.

Figure 6:
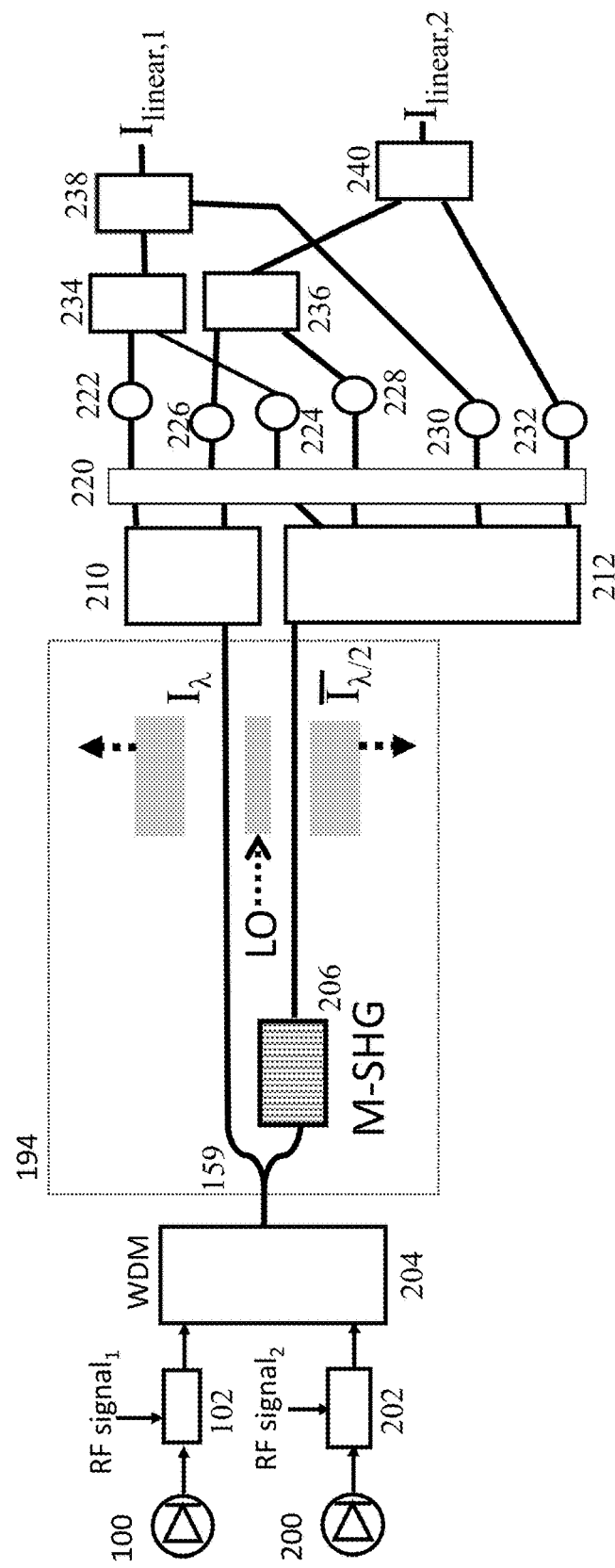
FIG. 6 Wavelength division multiplexed (WDM) down-conversion system where multiple wavelengths modulated by different RF signals are down-converted using a common electrode, and each wavelength is also frequency-doubled in an SHG stage that uses multiple phase matching peaks to allow for linearization at each optical wavelength.

FIG. 6 shows an embodiment that uses a single SHG linearized DC phase modulator photonic integrated circuit 194 to process multiple (in this case two) different input RF signals. Here two lasers having wavelengths $\lambda_1$ 100 and $\lambda_2$ 200 are sent to different signal phase modulators 102,202, where $\lambda_1$ is modulated by RF signal$_1$ and $\lambda_1$ is modulated by RF signal$_2$. The two-wavelength optical signal of mean wavelength $\lambda_o = (\lambda_1 + \lambda_2)/2$ is combined in a wavelength division multiplexer 204 (WDM) so both wavelengths can travel to the DC PM over a single fiber. Typically $\lambda_1$ and $\lambda_2$ will be in the same wavelength band, such as at 1550 nm and 1556 nm.

Ignoring for the time being the modified SHG stage (M-SHG) 206, the two wavelength signal is split in an optical splitter 159 so that similarly to FIG. 4 a top arm is modulated in-phase I with the LO and a bottom arm is modulated out-of-phase Ī with the LO creating complementary signals at both wavelengths. An in-phase wavelength division multiplexer 210 separates the I signals at $\lambda_1$ and $\lambda_2$ which are filtered in an optical filtering system 220 and detected in photodetectors 222,226. An out-of-phase WDM 212 separates the Ī signals at $\lambda_1$ and $\lambda_2$ which are filtered in an optical filtering system 220 and detected in photodetectors 224,228. The I and Ī signals of $\lambda_1$ are subtracted in a first electrical hybrid 234, and the I and Ī signals of $\lambda_2$ are subtracted in a second electrical hybrid 236. These balanced detected signals represent the down-converted signals from RF signal$_1$ and RF signal$_2$, respectively. Thus a single PM-DC has been used to down-convert multiple RF signals from different locations by exploiting WDM technology.

The modified SHG or M-SHG stage 206 can optionally be used to help improve dynamic range via linearization. The M-SHG stage is designed so that it will phase match both $\lambda_1$ and $\lambda_2$ for SHG, which can for instance be realized by appropriate periodic poling as is known in the art. One such embodiment can manipulate the periodic poling scheme to have a multi-peaked phase matching curve, with phase matching peaks at $\lambda_1$ and $\lambda_2$. Assuming the M-SHG stage has low conversion efficiency, most of the input optical signal at $\lambda_1$ and $\lambda_2$ exits the device unchanged, but a small portion such as 12% of the power at each wavelength is converted to their respective harmonic wavelengths at $\lambda_1/2$ and $\lambda_2/2$ which carry double the phase modulation depth as the fundamental wavelengths. The harmonic wavelengths are modulated by the LO using the same hot electrode as the $\lambda_1$ and $\lambda_2$ signals. The LO modulated harmonic wavelengths are separated in the out-of-phase WDM to be filtered in the optical processor and detected by photo-detectors 230,232. The photo-detected down-converted harmonic signal at $\lambda_1/2$ is subtracted from the balanced photo-detected signal derived from $\lambda_1$ that exits the first electrical hybrid in a first linearization combiner 238. The photo-detected down-converted harmonic signal at $\lambda_2/2$ is subtracted from the balanced photo-detected signal derived from $\lambda_2$ that exist the second electrical hybrid in a second linearization combiner 240. A single M-SHG stage thus allowing multiple RF signals carried on multiple optical wavelengths to be linearized using a single hot electrode of the photonic integrated circuit. The invention can be extended to down-convert more RF input signals as would be apparent to one skilled in the art. It is possible to use harmonic generation to linearize M of the N RF input signals, where M≤N.

Figure 7:
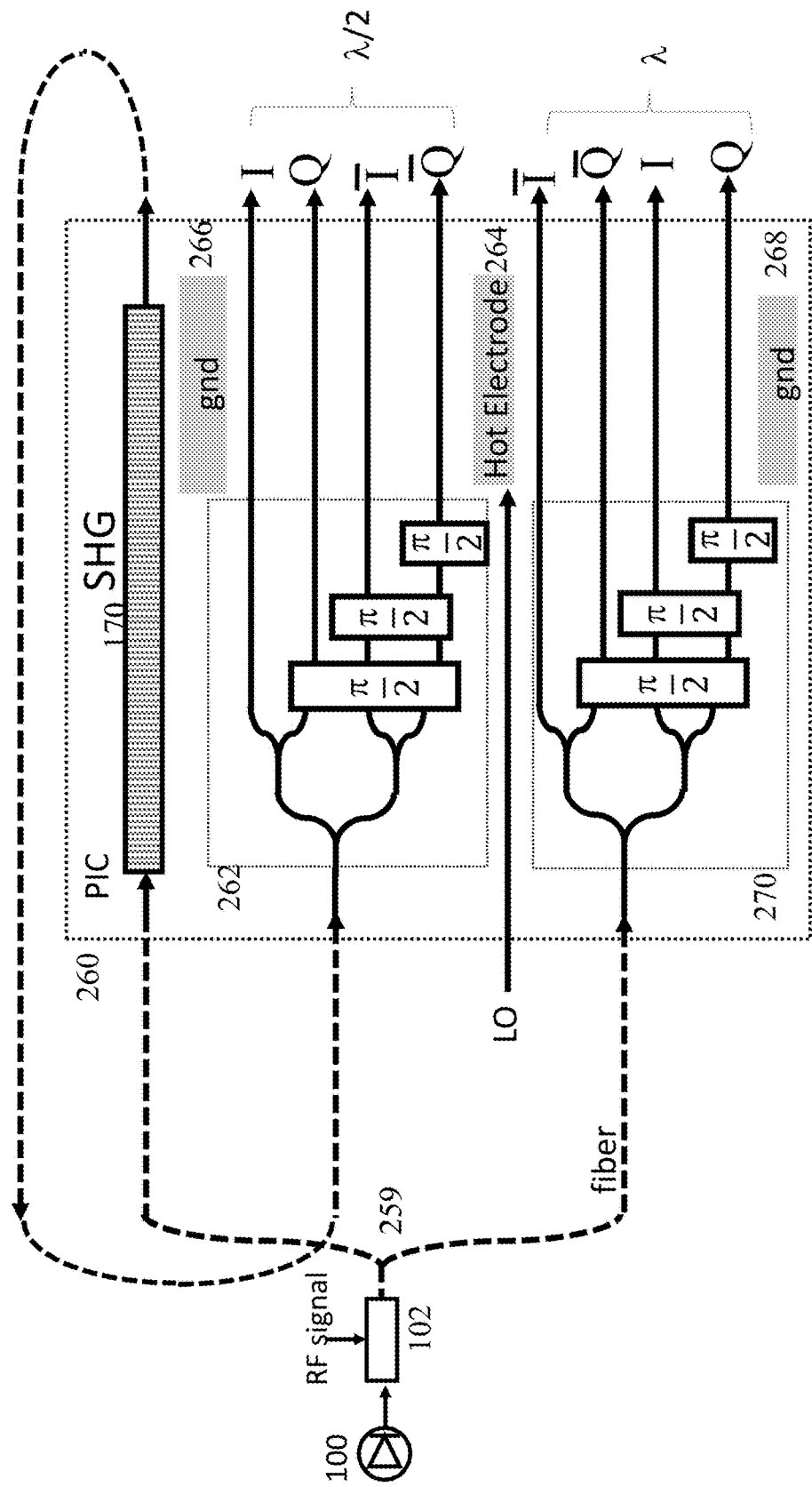
FIG. 7: Balanced SHG linearized down-conversion where both complementary outputs at I and Q phases are generated for both wavelengths by using appropriate integrated optical delays and a common hot electrode.

FIG. 7 shows an embodiment that allows complementary I and Q signals for both the optical signal at the laser wavelength $\lambda$ and the optical signal at the SHG wavelength $\lambda/2$, with just a single hot electrode. The design is well suited for photonic integration. The embodiment of FIG. 6 uses only a single hot electrode and is efficient in terms of the LO power since the LO field is used to modulate all the optical signal paths. The voltage required from the LO signal is kept small in such a design, especially if a modulator technology that can create waveguides with very small modes (e.g. 1 µm) is used since putting multiple waveguides between a hot and ground electrode separated by a typical electrode spacing of on the order of 10 µm can allow the multiple waveguides to experience similar electric fields (thus optical phase shift) and have negligible coupling between the waveguides since the modes are well confined in their respective waveguides. If the waveguide modes are larger such as 5 µm then the electrodes would need to be spaced further apart which may have an adverse effect on the performance.

The phase modulated input signal is split in two in an optical splitter 259. One output of the splitter drives the SHG stage 170. Fiber optical cable external to the $\lambda$-and-$\lambda/2$ I/Q PIC 260 is denoted in dashed lines. The output of the SHG stage at a wavelength of $\lambda/2$ is coupled into fiber to be fed back into a $\lambda/2$ complementary I/Q optical phase splitter 262, which splits the input into four output paths, with each path delayed by an additional $\pi/2$ phase at the LO frequency, where the delay is $\tau_{delay}=i\cdot(\pi/2)/(2\cdot\pi\cdot f_{LO})$ and 'i' is $\{0,1,2,3\}$. It is possible to integrate the SHG stage into the PIC so that fiber-feedback is not required thus reducing coupling loss, but the feed-back design allows the SHG stage to be made longer and thus more efficient in terms of how much power at wavelength $\lambda$ is required to generate a given power at wavelength $\lambda/2$.

All four paths from the $\lambda/2$ optical phase splitter 262 pass between a hot electrode 264 driven by the LO and a first ground electrode 266, and experience nearly identical phase shifts from the LO. However, due to the $\lambda/2$ optical phase splitter the input signal in each path has been delayed by a different time (phase) with respect to the LO frequency such that the four modulated outputs are the I, Q, and complementary I and complementary Q signals.

The other output of the optical splitter drives a $\lambda$ optical phase splitter 270 that performs the same function as the $\lambda/2$ optical phase splitter but at the wavelength of $\lambda$. The hot electrode causes a phase shift on all four outputs due to the electric field between it and the second ground electrode 268. The phase applied in this direction is $\pi$ out of phase with the $\lambda/2$ signals, but since both complementary I and Q signals (4 different signals that after processing will be $\pi/2$ out of phase with each other) are generated this additional phase shift simply changes the output port that each of the I and Q, and complimentary I and Q outputs are sent to and has no substantial impact on the function of the device.

The design of FIG. 7 is narrowband in that the LO frequency should be matched to the delays of the optical phase splitters. If a specific LO frequency is to be used then this design is suitable, but otherwise the optical phase splitters could be tunable, such as could be realized by using variable optical delay lines instead of fixed delay lines to achieve the $\pi/2$ phase shifts. We note that the delay of the harmonic signal caused by the SHG stage and fiber optical cable can be compensated by adding suitable delay on the $\lambda$-wavelength signals as needed.

Figure 8:
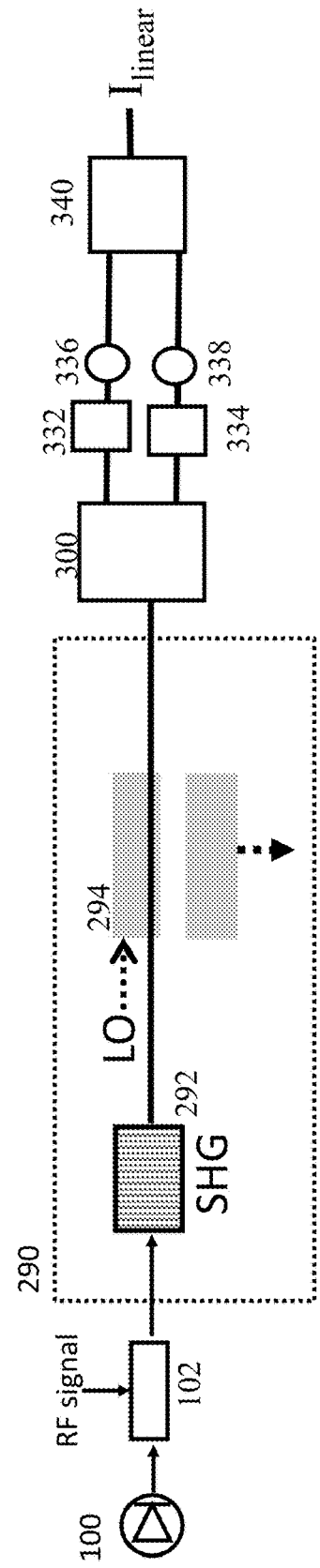
FIG. 8: SHG linearized photonic down-conversion scheme using a single waveguide to carry both $\lambda$ and $\lambda/2$ wavelengths which share a common hot electrode in the DC phase modulator.

FIG. 8 shows another embodiment of the invention which is an SHG linearized DC system using a single waveguide SHG DC PM 290. In this embodiment there is no optical splitter, and instead the SHG stage 292 converts only a small portion of the incoming signal at wavelength $\lambda$ to wavelength $\lambda/2$, for instance 12.5% of the signal. Both wavelengths then travel through the same PM defined by a single hot electrode 294 and both are modulated by the same LO applied to the hot electrode. A common ground can be located co-planer as in the diagram or on the bottom of the substrate. The harmonic and fundamental wavelengths can be separated after the DC PM in a $\lambda$-to-$\lambda/2$ WDM 300 and processed as usual in filters 332,334 and photo-detectors 336,338 before being subtracted in an electrical hybrid 340 to realize a linearized down-converted output $I_{linear}$.

What is claimed is:

1. An apparatus for down-converting an input radio frequency (RF) electromagnetic signal, comprising:
    a first signal phase modulator that imparts the RF signal at a center frequency of $f_{RF,0}$ onto an optical signal at a fundamental wavelength centered at $\lambda_0$ thus creating a phase modulated optical signal;
    the phase modulated optical signal being sent to a first down-converting (DC) phase modulator that applies a phase modulation at an RF local oscillator (LO) at a frequency $f_{LO}$ onto the phase modulated optical signal;
    the DC phase modulator separating the phase modulated optical signal into two modes wherein one mode is phase modulated in-phase with the LO and the other mode is phase modulated at a relative phase of $\phi$ with respect to the LO; the two modes being modulated by a common hot electrode;
    the LO modulated optical signals in the two modes then being processed and photo-detected so as to generate a first down-converted electrical signal that is in-phase (I) with the LO and a second down-converted electrical signal that is at phase $\phi$ with respect to the LO, where the down-converted signal is shifted in frequency to $f_{DC}=|f_{RF,0}-f_{LO}|$; whereas the I and the $\phi$ down-converted electrical signals are electrically processed to form a net RF output at $f_{DC}$; the creation of both the I phase and the $\phi$ phase down-converted electrical signals allowing for additional signal processing.

2. The apparatus of claim 1, wherein $\phi=\pi$ creating an out-of-phase signal $\bar{I}$; whereas the I and $\bar{I}$ down-converted electrical signals are electrically subtracted during the electrical signal processing thus reducing common mode noise and increasing signal-to-noise ratio on the net RF output.

3. The apparatus of claim 2, wherein the two modes are two spatially separated arms; the in-phase arm being located between the hot electrode driven by the LO and a first ground electrode and the out-of-phase arm being located between the common hot electrode and a second ground electrode.

4. The apparatus of claim 1, wherein $\phi=\pi/2$ creating a quadrature-phase signal Q; whereas the I and Q down-converted electrical signals are processed to reject an image band.

5. The apparatus of claim 1, wherein a nonlinear second harmonic generation (SHG) stage is located between the first signal phase modulator and the DC phase modulator, the SHG stage creating a harmonic optical signal at a harmonic optical wavelength centered at $\lambda_0/2$; whereas the harmonic optical signal has a phase modulation depth which is double compared to a phase modulation depth of the fundamental optical signal at the fundamental wavelength $\lambda_0$; the harmonic optical signal being modulated by the LO in a harmonic wavelength DC phase modulator; the LO-modulated harmonic optical signal is then processed and photo-detected to generate a harmonic down-converted electrical signal; the harmonic down-converted electrical signal being subtracted from the net RF output signal to form a linearized RF output thus cancelling out unwanted nonlinear distortions and thereby improving a dynamic range of the down-converted RF signal.

6. The apparatus of claim 5, wherein the harmonic wavelength DC phase modulator shares a hot electrode with the fundamental wavelength DC phase modulator.

7. The apparatus of claim 1, further comprising N additional signal phase modulators imparting N additional RF signals where each signal phase modulator modulates one of N distinct optical signals of wavelength labeled $\lambda_N$, the additional RF signals being either of the same or different RF carrier frequencies as $f_{RF,0}$; wherein the N+1 phase modulated optical signals are combined in an optical combiner prior to the LO phase modulation; the DC phase modulator thereby phase modulating the LO onto all N+1 phase modulated optical signals simultaneously; whereas a wavelength division multiplexer (WDM) located after the DC phase modulator separates the N+1 wavelengths to allow them to be separately processed and detected as N+1 net RF outputs thereby allowing for multiple RF signals to be down-converted using a single DC phase modulator.

8. The apparatus of claim 7, whereas M of the N+1 optical signals are processed in a nonlinear second harmonic generation (SHG) stage; the SHG stage doubling the optical frequency and thereby doubling an optical phase modulation depth on all M≤N+1 optical signals that pass through it which are within its phase-matching bandwidth; the phase-matching bandwidth being comprised of discrete peaks; the SHG stage creating M optical signals at a harmonic optical wavelength centered at $\lambda_0/2$; the harmonic optical signal being modulated by the LO in a harmonic wavelength DC phase modulator; the harmonic optical signal subsequently processed and photo-detected to generate a harmonic down-converted electrical signal; the harmonic down-converted electrical signal being subtracted from the net RF output signals to form linearized RF outputs thus cancelling out unwanted nonlinear distortions and thereby improving dynamic ranges of the N+1 down-converted net RF output signals.

9. The apparatus of claim 1, wherein the two modes are two different wavelengths with a mean of the two wavelengths being $\lambda_0$, whereas a wavelength-dependent phase shift $\alpha(\lambda)$; the $\alpha(\lambda)$ is applied prior to the LO phase modulation; the wavelength-dependent phase shift acting to apply the $\phi$ relative phase shift at $f_{LO}$, between the two different wavelengths; the two wavelengths being optically processed and separately photo-detected to create the first and second down-converted electrical signals.

10. The apparatus of claim 9, whereas the two wavelengths are derived from a common optical frequency and the wavelength dependent phase shift $\alpha(\lambda)$ is applied by using a first wavelength division multiplexer (WDM) to split the two wavelengths into two arms; the two arms having different optical delays, then re-combining the two wavelengths in an optical combiner so that both modes propagate in the same arm while undergoing the LO phase modulation.

11. The apparatus of claim 9, wherein $\phi=\pi$ thereby creating an out-of-phase signal $\bar{I}$; whereas the I and $\bar{I}$ down-converted signals are electrically subtracted during the additional signal processing thus reducing common mode noise and increasing signal-to-noise ratio on the net RF output.

12. The apparatus of claim 9, whereas $\phi=\pi/2$ thereby allowing for an image-band rejection in the net RF output signal.

13. The apparatus of claim 1, whereas the phase difference $\phi$ between the two modes is applied by splitting the phase modulated optical signal in the DC phase modulator into two physically separated branches, optically delaying one branch with respect to the other with a delay of $\tau=(1/f_{LO})\cdot(\phi/2\pi)$ where $\phi$ is in radian units; phase-modulating both branches using common electrodes.

14. The apparatus of claim 1, whereas the phase difference $\phi$ between the two modes is applied by splitting the phase modulated optical signal into two branches, optically delaying one branch with respect to the other by an equivalent time of $\tau=(1/f_{LO})\cdot\{(\phi+\pi)/2\pi)\}$ where $\phi$ is in radian units; phase-modulating both branches using a common hot electrode.

15. The apparatus of claim 1, whereas the phase modulated optical signal is processed in a nonlinear second harmonic generation (SHG) stage, the SHG stage doubling an optical frequency and thereby doubling an optical phase modulation depth at an optical wavelength of $\lambda_o/2$; the phase modulated optical signals at $\lambda_o$ and at $\lambda_o/2$ being the two modes of the DC phase modulator; whereas the I and $\phi$ down-converted electrical signals are combined in order to cancel out unwanted nonlinear distortions to form a linearized RF output of improved dynamic range.

16. A method for down-converting an input radio frequency (RF) electromagnetic signal, comprising: phase modulating an RF signal onto an optical carrier, splitting the optical carrier into two modes, phase modulating a RF local oscillator (LO) onto the two modes using a common hot electrode where each mode has a distinct relative phase with respect to the LO signal; processing and photo-detecting the two LO-modulated optical carriers to create two down-converted electrical signals of distinct relative phases; and electrically processing the two down-converted electrical signals of distinct phases to create a net RF output signal of higher quality than either of the two down-converted electrical signals.

17. The method of claim 16, wherein the distinct relative phase between the two modes is $\pi$, and the net RF output signal is created by subtracting the two down-converted electrical signals in order to subtract out common mode noise.

18. The method of claim 16, wherein the optical carrier is split into two spatially distinct modes and a relative optical delay is applied to one of the two modes to realize the distinct relative phase between the two modes.

19. The method of claim 16, wherein the optical carrier is comprised of two distinct optical wavelengths; the two wavelengths serving as the two modes; whereas after the RF signal is phase modulated on the optical carrier but before the LO is phase-modulated on the carrier the two wavelengths experience a wavelength-dependent phase shift such that the LO is phase-modulated onto both wavelengths with a different relative LO phase.

20. A method for down-converting a plurality of input radio frequency (RF) electromagnetic signals, comprising: phase modulating an RF signal onto a plurality of optical carriers of distinct wavelengths; combining the plurality of distinct wavelengths carriers into a single input channel; splitting the single input channel into two physically distinct branches; phase modulating the two physically distinct branches with a local oscillator (LO) using a phase modulator with a common hot electrode that applies phase shifts that are $\pi$ out-of-phase between the two channels; separating the plurality of wavelengths in the two branches so each wavelength carrier can be separately processed and photo-detected; and subtracting the two photo-detected signals from each of the branches that are at a common wavelength carrier to subtract out a common mode noise and improve a signal-to-noise ratio.

* * * * *